United States Patent
Rutowski et al.

(10) Patent No.: US 11,949,295 B2
(45) Date of Patent: Apr. 2, 2024

(54) POWER TOOL PRINTED CIRCUIT BOARD INCLUDING EMBEDDED BUSBARS

(71) Applicant: MILWAUKEE ELECTRIC TOOL CORPORATION, Brookfield, WI (US)

(72) Inventors: Lucas A. Rutowski, Milwaukee, WI (US); Maxwell L Merget, Milwaukee, WI (US); Douglas R. Fieldbinder, Greendale, WI (US)

(73) Assignee: Milwaukee Electric Tool Corporation, Brookfield, WI (US)

( * ) Notice: Subject to any disclaimer, the term of this patent is extended or adjusted under 35 U.S.C. 154(b) by 268 days.

(21) Appl. No.: 17/236,432

(22) Filed: Apr. 21, 2021

(65) Prior Publication Data

US 2021/0328482 A1    Oct. 21, 2021

Related U.S. Application Data

(60) Provisional application No. 63/047,313, filed on Jul. 2, 2020, provisional application No. 63/013,226, filed on Apr. 21, 2020.

(51) Int. Cl.
*H02K 11/21*    (2016.01)
*H02K 5/22*    (2006.01)
(Continued)

(52) U.S. Cl.
CPC .......... *H02K 11/215* (2016.01); *H02K 5/225* (2013.01); *H02K 11/0094* (2013.01); *H05K 1/181* (2013.01); *H05K 2201/1009* (2013.01); *H05K 2201/10166* (2013.01); *H05K 2201/10272* (2013.01)

(58) Field of Classification Search
CPC ........ H02K 5/225; H02K 7/145; H02K 11/33; H02K 11/0094; H02K 11/215; H05K 1/183; H05K 1/185; H05K 1/0271; H05K 1/181

See application file for complete search history.

(56) References Cited

U.S. PATENT DOCUMENTS 6,445,097 B1    9/2002    Zeiler et al.
6,701,604 B2    3/2004    Zeiler et al.
(Continued)

FOREIGN PATENT DOCUMENTS

CN    210041490 U    2/2020
KR    1020160084541 A    7/2016

OTHER PUBLICATIONS

International Search Report and Written Opinion for Application No. PCT/US2021/028370 dated Aug. 6, 2021 (12 pages).

*Primary Examiner* — Leda T Pham
(74) *Attorney, Agent, or Firm* — Michael Best & Friedrich LLP

(57) ABSTRACT

A power tool that includes a motor and a printed circuit board ("PCB"). The motor includes a rotor and a stator. The stator includes a plurality of stator terminals. The PCB is electrically connected to the stator. The PCB includes a switch and an embedded busbar. A first end of the embedded busbar is electrically connected to the switch. The embedded busbar extends away from the PCB. A second end of the embedded busbar electrically connects to a stator terminal of the plurality of stator terminals for providing power to the motor using the switch. The embedded bus bar is embedded between two layers of the printed circuit board.

20 Claims, 12 Drawing Sheets

(51) Int. Cl.
  *H02K 11/00* (2016.01)
  *H02K 11/215* (2016.01)
  *H05K 1/18* (2006.01)

(56) References Cited

U.S. PATENT DOCUMENTS

| | | | |
|---|---|---|---|
| 6,757,175 B1 * | 6/2004 | Bartley | H05K 7/1492 |
| | | | 257/691 |
| 6,927,512 B2 | 8/2005 | Zeiler et al. | |
| 7,498,702 B2 | 3/2009 | Migita et al. | |
| 7,663,274 B2 | 2/2010 | Kataoka et al. | |
| 8,810,085 B2 | 8/2014 | Matsunaga et al. | |
| 9,154,009 B2 | 10/2015 | Alemu | |
| 9,318,932 B2 | 4/2016 | Purohit et al. | |
| 9,450,471 B2 | 9/2016 | Mergener et al. | |
| 9,450,472 B2 | 9/2016 | Hatfield et al. | |
| 9,774,229 B1 | 9/2017 | Mergener et al. | |
| 9,787,159 B2 | 10/2017 | Beyerl | |
| 9,812,930 B2 | 11/2017 | Purohit et al. | |
| 9,819,241 B2 | 11/2017 | Smith et al. | |
| 9,948,162 B2 | 4/2018 | Nagahama et al. | |
| 9,954,417 B2 | 4/2018 | Mergener et al. | |
| 9,954,418 B2 | 4/2018 | Kawakami et al. | |
| 9,960,656 B2 | 5/2018 | Mergener et al. | |
| 9,978,541 B2 | 5/2018 | Mitzutani et al. | |
| 10,056,806 B2 | 8/2018 | Hatfield et al. | |
| 10,348,158 B2 | 7/2019 | Niwa et al. | |
| 10,348,159 B2 | 7/2019 | Beyerl | |
| 10,523,080 B2 | 12/2019 | Smith et al. | |
| 10,530,220 B2 | 1/2020 | Mergener et al. | |
| 2002/0043882 A1 | 4/2002 | Tanaka et al. | |
| 2010/0327709 A1 * | 12/2010 | Minato | H02K 11/33 |
| | | | 361/736 |
| 2013/0342041 A1 | 12/2013 | Ayers et al. | |
| 2017/0093239 A1 * | 3/2017 | Teranishi | H02K 3/18 |
| 2017/0366060 A1 | 12/2017 | Haberkorn et al. | |
| 2018/0034346 A1 | 2/2018 | Purohit et al. | |
| 2018/0094688 A1 | 4/2018 | Schmidt et al. | |
| 2018/0123414 A1 | 5/2018 | Kim | |
| 2018/0174773 A1 | 6/2018 | Mitzutani et al. | |
| 2018/0205288 A1 | 7/2018 | Nagahama et al. | |
| 2018/0205293 A1 | 7/2018 | Kawakami et al. | |
| 2018/0219436 A1 | 8/2018 | Shiozawa et al. | |
| 2018/0219460 A1 | 8/2018 | Shiozawa et al. | |
| 2018/0248446 A1 | 8/2018 | Mergener et al. | |
| 2018/0262092 A1 | 9/2018 | Beyerl et al. | |
| 2018/0294688 A1 | 10/2018 | Smith et al. | |
| 2018/0323681 A1 | 11/2018 | Hatfield et al. | |
| 2019/0006980 A1 | 1/2019 | Sheeks et al. | |
| 2019/0044110 A1 | 2/2019 | Sheeks et al. | |
| 2019/0044415 A1 | 2/2019 | Hatfield et al. | |
| 2019/0103784 A1 | 4/2019 | Kamada et al. | |
| 2019/0280559 A1 | 9/2019 | Beyerl | |
| 2019/0280560 A1 | 9/2019 | Niwa et al. | |
| 2020/0106380 A1 * | 4/2020 | Sheeks | H02P 6/26 |
| 2021/0305853 A1 * | 9/2021 | Takahashi | H02K 3/28 |
| 2021/0305870 A1 * | 9/2021 | Takahashi | H02K 5/08 |

* cited by examiner

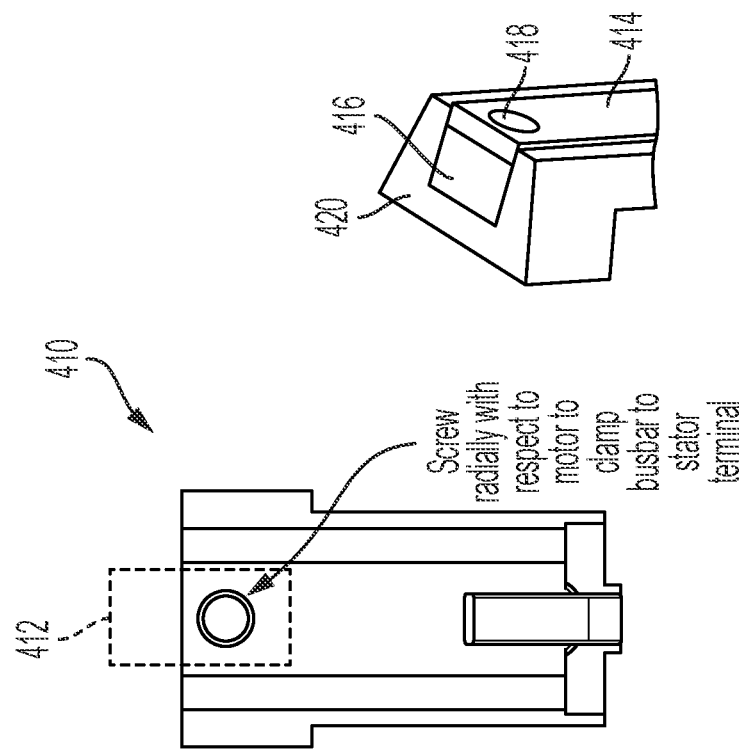
FIG. 4C
FIG. 4B
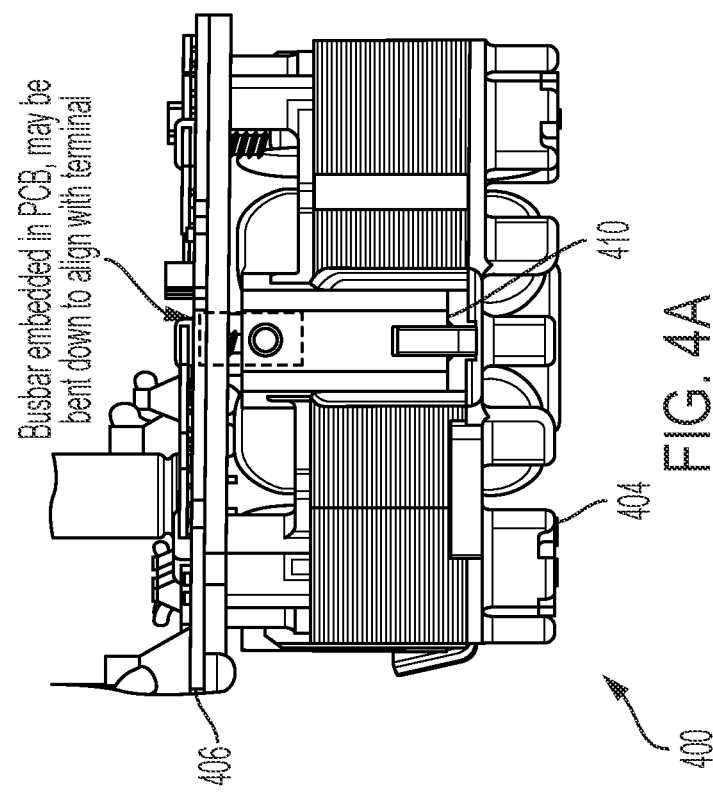
FIG. 4A

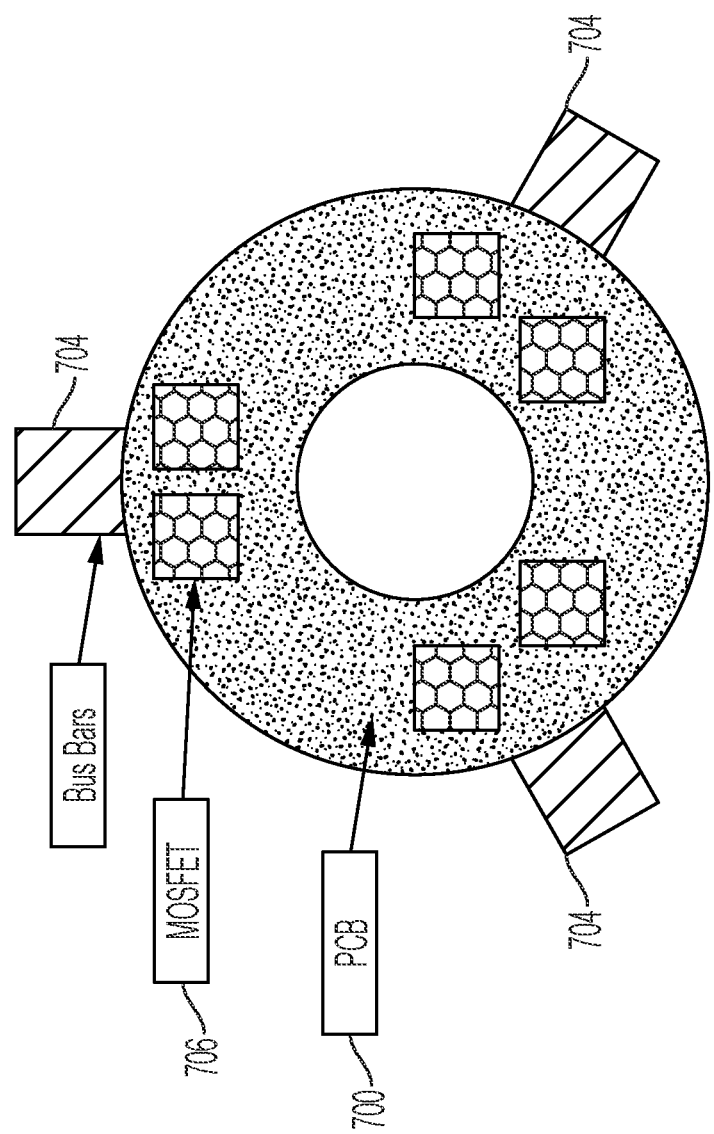

POWER TOOL PRINTED CIRCUIT BOARD INCLUDING EMBEDDED BUSBARS

RELATED APPLICATIONS

This application claims the benefit of U.S. Provisional Patent Application No. 63/013,226, filed on Apr. 21, 2020, and U.S. Provisional Patent Application No. 63/047,313, filed on Jul. 2, 2020, the entire contents of which are hereby incorporated by reference.

FIELD

Embodiments described herein relate to a printed circuit board for a power tool.

SUMMARY

A power tool, such as an impact wrench, includes a motor having a rotor and a stator. The stator includes a plurality of stator terminals (e.g., three stator terminals) which are in connection with a plurality of switches (e.g., field effect transistors ["FETs"], metal-oxide-semiconductor FETs ["MOSFETs"], etc.). The switches are mounted on a print circuit board ("PCB") for providing power to the motor. The stator terminals may be electrically connected to the PCB using wires extending from the stator terminals. However, in such instances, the wires may be in connection with the PCB via soldering. Solder connections are subject to solder breakage from vibrations.

Embodiments described herein provide a power tool that includes a motor and a printed circuit board ("PCB"). The motor includes a rotor and a stator. The stator includes a plurality of stator terminals. The PCB is electrically connected to the stator. The PCB includes a switch and an embedded busbar. A first end of the embedded busbar is electrically connected to the switch. The embedded busbar extends away from the PCB. A second end of the embedded busbar electrically connects to a stator terminal of the plurality of stator terminals for providing power to the motor using the switch. The embedded bus bar is embedded between two layers of the printed circuit board.

Embodiments described herein also provide a power tool that includes a motor and a printed circuit board ("PCB"). The motor includes a rotor and a stator. The stator includes a plurality of stator terminals. The PCB is electrically connected to the stator. The PCB includes a switch and an embedded busbar. A first end of the embedded busbar is electrically connected to the switch. The embedded busbar extends away from the PCB. A second end of the embedded busbar electrically connects to a stator terminal of the plurality of stator terminals for providing power to the motor using the switch. The embedded bus bar is embedded between two layers of the printed circuit board. The stator terminal is mounted to a non-conductive block and includes a hook at a first end of the stator terminal.

Embodiments described herein further provide a power tool that includes a motor and a printed circuit board ("PCB"). The motor includes a rotor and a stator. The stator includes a plurality of stator terminals. The PCB is electrically connected to the stator. The PCB includes a switch and an embedded busbar. A first end of the embedded busbar is electrically connected to the switch. The embedded busbar extends away from the PCB. A second end of the embedded busbar electrically connects to a stator terminal of the plurality of stator terminals for providing power to the motor using the switch. The embedded bus bar is embedded between two layers of the printed circuit board. The second end of the embedded busbar extends radially outward from the PCB about a central axis of the PCB.

Before any embodiments are explained in detail, it is to be understood that the embodiments are not limited in its application to the details of the configuration and arrangement of components set forth in the following description or illustrated in the accompanying drawings. The embodiments are capable of being practiced or of being carried out in various ways. Also, it is to be understood that the phraseology and terminology used herein are for the purpose of description and should not be regarded as limiting. The use of "including," "comprising," or "having" and variations thereof are meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings.

In addition, it should be understood that embodiments may include hardware, software, and electronic components or modules that, for purposes of discussion, may be illustrated and described as if the majority of the components were implemented solely in hardware. However, one of ordinary skill in the art, and based on a reading of this detailed description, would recognize that, in at least one embodiment, the electronic-based aspects may be implemented in software (e.g., stored on non-transitory computer-readable medium) executable by one or more processing units, such as a microprocessor and/or application specific integrated circuits ("ASICs"). As such, it should be noted that a plurality of hardware and software based devices, as well as a plurality of different structural components, may be utilized to implement the embodiments. For example, "servers," "computing devices," "controllers," "processors," etc., described in the specification can include one or more processing units, one or more computer-readable medium modules, one or more input/output interfaces, and various connections (e.g., a system bus) connecting the components.

Relative terminology, such as, for example, "about," "approximately," "substantially," etc., used in connection with a quantity or condition would be understood by those of ordinary skill to be inclusive of the stated value and has the meaning dictated by the context (e.g., the term includes at least the degree of error associated with the measurement accuracy, tolerances [e.g., manufacturing, assembly, use, etc.] associated with the particular value, etc.). Such terminology should also be considered as disclosing the range defined by the absolute values of the two endpoints. For example, the expression "from about 2 to about 4" also discloses the range "from 2 to 4". The relative terminology may refer to plus or minus a percentage (e.g., 1%, 5%, 10%, or more) of an indicated value.

It should be understood that although certain drawings illustrate hardware and software located within particular devices, these depictions are for illustrative purposes only. Functionality described herein as being performed by one component may be performed by multiple components in a distributed manner. Likewise, functionality performed by multiple components may be consolidated and performed by a single component. In some embodiments, the illustrated components may be combined or divided into separate software, firmware and/or hardware. For example, instead of being located within and performed by a single electronic processor, logic and processing may be distributed among multiple electronic processors. Regardless of how they are combined or divided, hardware and software components may be located on the same computing device or may be distributed among different computing devices connected by one or more networks or other suitable communication links. Similarly, a component described as performing particular functionality may also perform additional functionality not described herein. For example, a device or structure that is "configured" in a certain way is configured in at least that way but may also be configured in ways that are not explicitly listed.

Other aspects of the embodiments will become apparent by consideration of the detailed description and accompanying drawings.

BRIEF DESCRIPTION OF THE DRAWINGS

FIGS. 4A, 4B, and 4C illustrate a printed circuit board ("PCB") embedded busbar in connection with a stator terminal, according to embodiments described here.

FIG. 7A illustrates a PCB including embedded busbars, according to embodiments described here.

DETAILED DESCRIPTION

Embodiments described herein relate to an electrical device such as a power tool which includes busbars embedded in a print circuit board ("PCB"). The power tool includes a motor. The motor includes a rotor and a stator. The stator includes a plurality of stator terminals (e.g., three stator terminals). The PCB is electrically connected to the stator. The PCB includes a plurality of switches and a plurality of embedded busbars. In some embodiments, the PCB includes at least six switches. The switches are, for example, field effect transistors ("FETs"), such as metal-oxide-semiconductor FETs ("MOSFETs"). In some embodiments, the PCB includes three embedded busbars. A first end of a busbar is electrically connected to one or more of the switches. Each of the busbars extends away (e.g., radially away) from the printed circuit board. Each busbar can be aligned with a corresponding stator terminal (e.g., by bending the busbar). A second end of each of the plurality of the embedded busbars electrically connects to the corresponding stator terminal for providing power to the motor through control of the one or more switches. In some embodiments, the embedded busbars electrically connect to the stator terminals by a screw that affixes the bus bar to the terminal (e.g., the terminal includes a threaded screw hole for receiving a screw). In other embodiments, each of the embedded busbars electrically connects to the corresponding stator terminal using, for example, welding.

Figure 1:
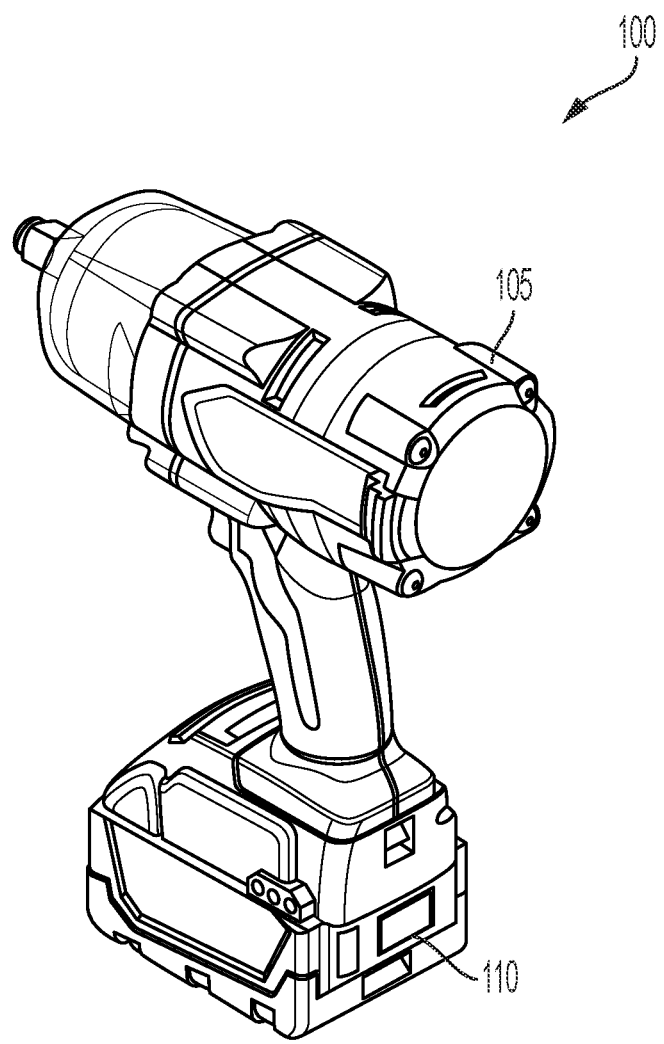
FIG. 1 illustrates a power tool, according to embodiments described here.

FIG. 1 illustrates a power tool 100. The power tool 100 may be, for example, an impact wrench, a drill, a ratchet, a saw, a hammer drill, an impact driver, a rotary hammer, a grinder, a blower, a trimer, etc. The power tool 100 includes a housing or a motor housing 105 which houses a motor (see FIG. 3) within the power tool 100. The power tool is configured to receive a power source 110 that provides DC power to the various components of the power tool 100, including the motor. The power source 110 may be a power tool battery pack that is rechargeable and uses, for instance, lithium ion battery cells. In some embodiments, the power source 110 is an AC power source (e.g., 120V/60 Hz) and the power tool 100 receives power from a cord that is coupled to a standard wall outlet.

Figure 2:
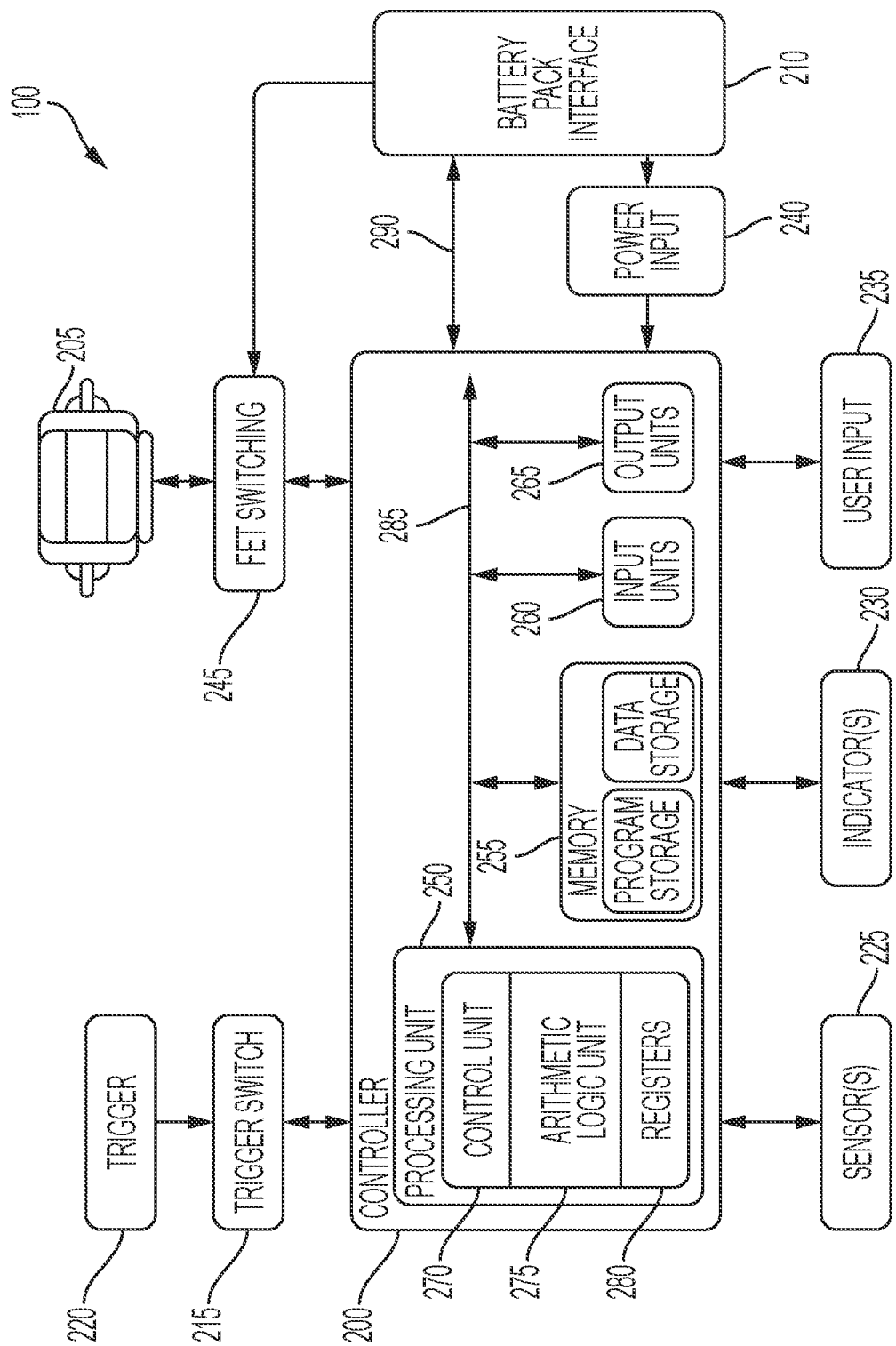
FIG. 2 illustrates a control system for the power tool of FIG. 1, according to embodiments described herein.

FIG. 2 illustrates a control system for the power tool 100. The control system includes a controller 200. The controller 200 is electrically and/or communicatively connected to a variety of modules or components of the power tool 100. For example, the illustrated controller 200 is electrically connected to a motor 205, a battery pack interface 220, a trigger switch 215 (connected to a trigger 220), one or more sensors or sensing circuits 225, one or more indicators 230, a user input module 235, a power input module 240, and a FET switching module 245 (e.g., including a plurality of switching FETs). The controller 200 includes combinations of hardware and software that are operable to, among other things, control the operation of the power tool 100, monitor the operation of the power tool 100, activate the one or more indicators 230 (e.g., an LED), etc.

The controller 200 includes a plurality of electrical and electronic components that provide power, operational control, and protection to the components and modules within the controller 200 and/or the power tool 100. For example, the controller 200 includes, among other things, a processing unit 250 (e.g., a microprocessor, a microcontroller, an electronic processor, an electronic controller, or another suitable programmable device), a memory 255, input units 260, and output units 265. The processing unit 250 includes, among other things, a control unit 270, an ALU 275, and a plurality of registers 280 (shown as a group of registers in FIG. 2), and is implemented using a known computer architecture (e.g., a modified Harvard architecture, a von Neumann architecture, etc.). The processing unit 250, the memory 255, the input units 260, and the output units 265, as well as the various modules or circuits connected to the controller 200 are connected by one or more control and/or data buses (e.g., common bus 285). The control and/or data buses are shown generally in FIG. 2 for illustrative purposes.

The memory 255 is a non-transitory computer readable medium and includes, for example, a program storage area and a data storage area. The program storage area and the data storage area can include combinations of different types of memory, such as a ROM, a RAM (e.g., DRAM, SDRAM, etc.), EEPROM, flash memory, a hard disk, an SD card, or other suitable magnetic, optical, physical, or electronic memory devices. The processing unit 250 is connected to the memory 255 and executes software instructions that are capable of being stored in a RAM of the memory 255 (e.g., during execution), a ROM of the memory 255 (e.g., on a generally permanent basis), or another non-transitory computer readable medium such as another memory or a disc.

Software included in the implementation of the power tool 100 can be stored in the memory 255 of the controller 200. The software includes, for example, firmware, one or more applications, program data, filters, rules, one or more program modules, and other executable instructions. The controller 200 is configured to retrieve from the memory 255 and execute, among other things, instructions related to the control processes and methods described herein. In other constructions, the controller 200 includes additional, fewer, or different components.

The battery pack interface 210 includes a combination of mechanical components (e.g., rails, grooves, latches, etc.) and electrical components (e.g., one or more terminals) configured to and operable for interfacing (e.g., mechanically, electrically, and communicatively connecting) the power tool 100 with a battery pack. For example, power provided by the battery pack 110 to the power tool 100 is provided through the battery pack interface 210 to the power input module 240. The power input module 240 includes combinations of active and passive components to regulate or control the power received from the battery pack 110 prior to power being provided to the controller 200. The battery pack interface 210 also supplies power to the FET switching module 245 to be switched by the switching FETs to selectively provide power to the motor 205. The battery pack interface 210 also includes, for example, a communication line 290 for provided a communication line or link between the controller 200 and the battery pack 110.

The indicators 230 include, for example, one or more light-emitting diodes ("LEDs"). The indicators 230 can be configured to display conditions of, or information associated with, the power tool 100. For example, the indicators 230 are configured to indicate measured electrical characteristics of the power tool 100, the status of the device, etc. The user input module 235 is operably coupled to the controller 200 to, for example, select a forward mode of operation or a reverse mode of operation, a torque and/or speed setting for the power tool 100 (e.g., using torque and/or speed switches), etc. In some embodiments, the user input module 235 includes a combination of digital and analog input or output devices required to achieve a desired level of control for the power tool 100, such as one or more knobs, one or more dials, one or more switches, one or more buttons, etc.

The sensors 225 include one or more current sensors, one or more speed sensors, one or more Hall-effect sensors, one or more temperature sensors, etc. The controller 200 calculates or includes, within memory 255, predetermined operational threshold values and limits for operation of the power tool 100. For example, when a potential thermal failure (e.g., of a FET, the motor 205, etc.) is detected or predicted by the controller 200, power to the motor 205 can be limited or interrupted until the potential for thermal failure is reduced.

Figure 3:
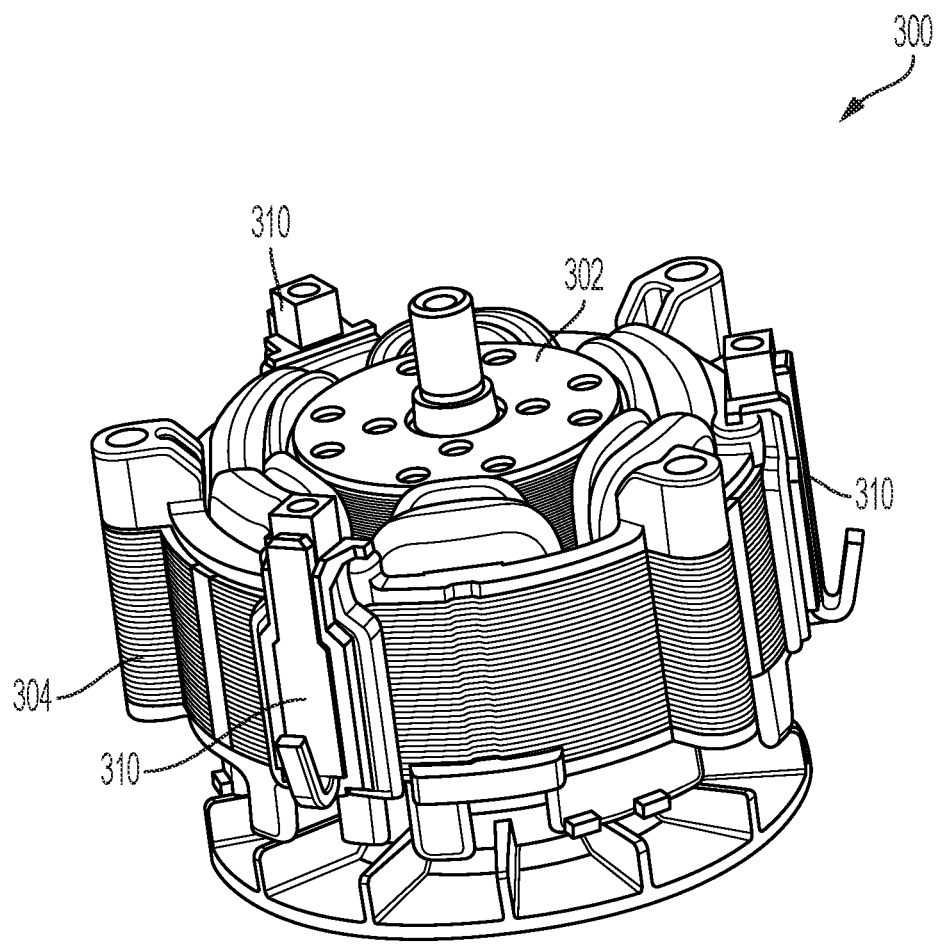
FIG. 3 illustrates a motor used in power tool, according to embodiments described here.

FIG. 3 illustrates an embodiment of a motor 300, which may be located in the motor housing 105 of the power tool 100. The motor 300 includes a rotor 302 and a stator 304. The stator 304 is the stationary part of the motor 300 and includes a plurality of attached stator terminals 310. The stator terminals 310 may be in connection with a plurality of switches, such as FETs or MOSFETs, on a PCB in the power tool 100 for providing control of the power to the motor 300.

FIGS. 4A, 4B, and 4C illustrate an embodiment of a motor 400, which may be located in the motor housing 105 of the power tool 100. The motor 400 includes a stator 404, a PCB 406, and a plurality of stator terminals 410. A busbar 412 embedded in the PCB 406 extends radially outward from the PCB 406 (e.g., with respect to a central axis of an approximately round PCB) and can be manipulated (e.g., bent) to interface with the stator terminal 410. The stator terminal 410 includes a metallic portion 414 (e.g., copper), a block portion 416 (e.g., copper, aluminum, steel, brass, etc.), a radial aperture 418 (e.g., the aperture is oriented radially with respect to the motor 400 and orthogonally to a rotor axis of the motor), and a molded insulating portion 420. In some embodiments, the aperture 418 is a threaded screw hole 418 for receiving a screw. In such embodiments, a screw extends through the busbar 412 into the screw hole 418. In some embodiments, the busbar 412 also includes an aperture through which a screw is able to pass. In some embodiments, the threaded screw hole 418 may include an M3 screw hole (e.g., tapped or untapped). A conductive surface filler can be applied to a screw to provide additional connection strength and minimized impedance between the screw/hole interface.

The metallic portion 414 and the block portion 416 can be welded together. An end of the busbars 412 is embedded in the PCB 406 and is connected to one or more switches (e.g., FETs) on the PCB 406. By integrating or embedding the busbar 412 into the PCB 406 a more robust electrical connection between the PCB 406 and the stator terminals 410 is achieved. As a result, the electrical connections between the PCB 406 and the stator terminals 410 are better able to withstand vibrations while the size of the motor stack may be reduced.

Figure 5B:
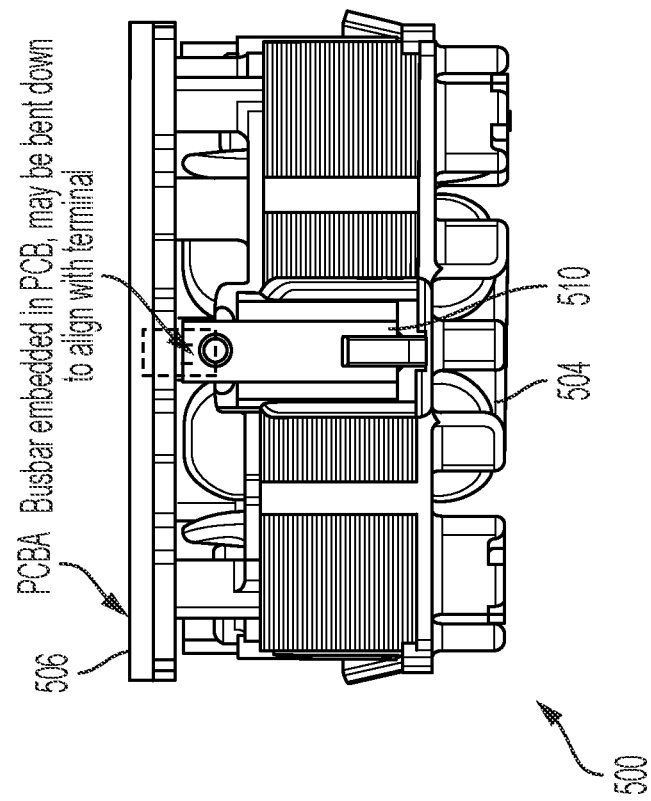
FIGS. 5A and 5B illustrate another PCB embedded busbar in connection with a stator terminal, according to embodiments described here.
Figure 5A:
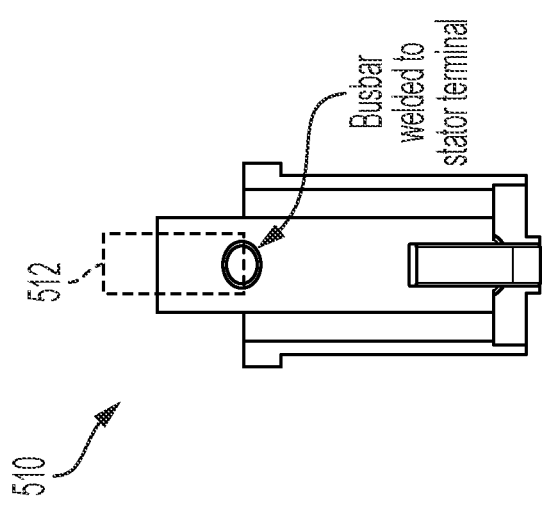

FIGS. 5A and 5B illustrate an embodiment of a motor 500, which may be located in the motor housing 105 of the power tool 100. The motor 500 includes a stator 504, a PCB 506, and a plurality of stator terminals 510. A busbar 512 embedded in the PCB 506 extends radially outward from the PCB 506 (e.g., with respect to a central axis of an approximately round PCB) and can be manipulated (e.g., bent) to interface with the stator terminal 510. In the embodiment illustrated in FIGS. 5A and 5B, the busbar 512 is welded to the stator terminal 510.

Figure 6:
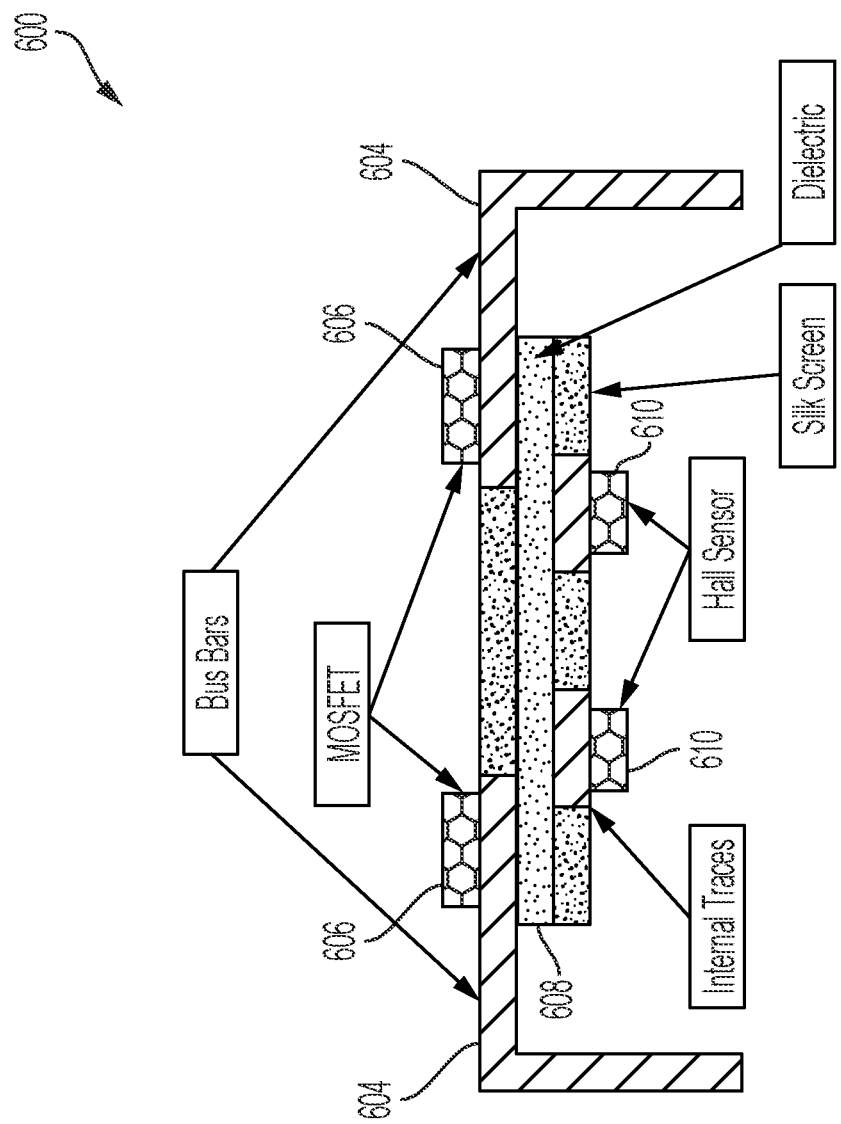
FIG. 6 illustrates a PCB with embedded busbars, according to embodiments described here.

FIG. 6 illustrates an embodiment of a PCB 600. As shown in FIG. 6, busbars 604 are embedded in the PCB 600. The PCB 600 may include one or more switches, such as the MOSFETs 606. As shown in FIG. 6, one end of each of the busbars 604 is connected to a MOSFET 606. Each of the busbars 604 may be electrically connected to a MOSFETs 606 on any layer of the PCB 600 (e.g., a top layer, a bottom layer, an intermediate layer, etc. The other end of each of the busbars 604 may be pre-formed or manipulated (e.g., bent) to align with a stator terminal of a motor. A dielectric portion or layer 608 separates a power portion of the PCB 600 (e.g., including MOSFETs 606) and a sensing portion of the PCB 600, which includes Hall-effect sensors 610. The dielectric 608 isolates the sensors 610 from interference, for example, from the switching of the MOSFETs 606.

FIG. 7A illustrates an embodiment of a PCB 700 that includes embedded busbars 704. The PCB 700, the busbars 704, and MOSFETs 706 may be substantially the same as the PCB 600, the busbars 604, and the MOSFETs 606 in FIG. 6. As shown in FIG. 7A, each embedded or integrated busbar 704 is connected with two MOSFETs 706 on the PCB 700 (e.g., corresponding to one phase of the stator).

Figure 7B:
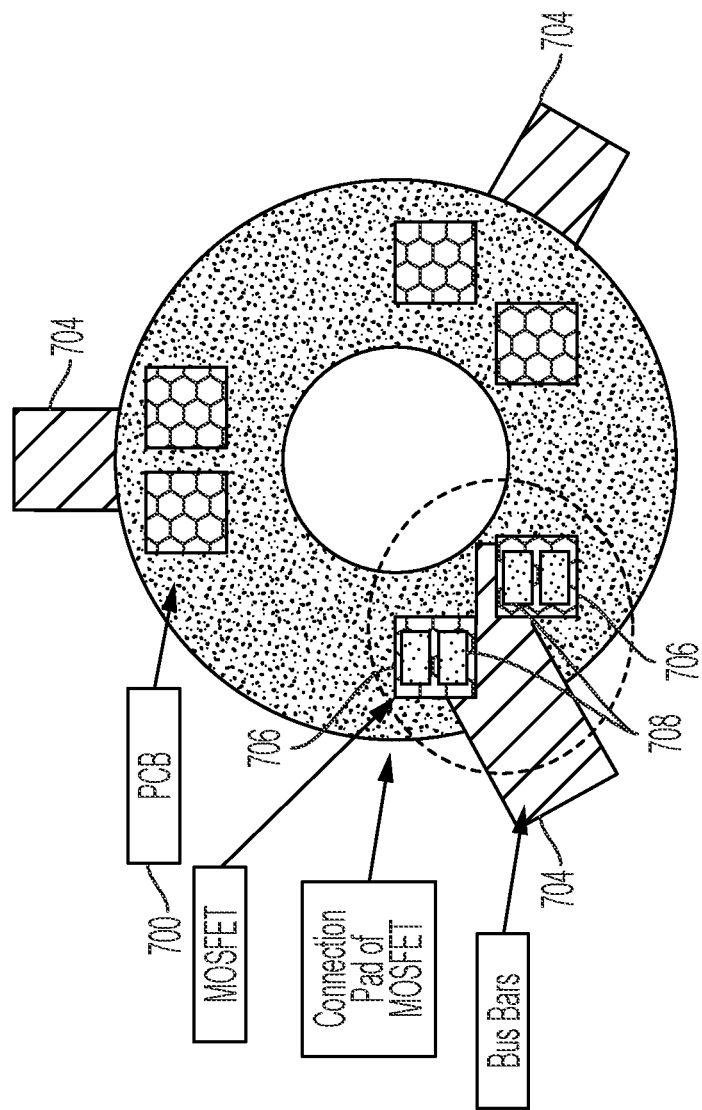
FIG. 7B illustrates the PCB including embedded busbars of FIG. 7A in a partial section view, according to embodiments described here.

FIG. 7B illustrates the PCB 700 in a partial section view (i.e., with at least one layer of the PCB 700 removed) with the embedded busbars 704. As shown in FIG. 7B, each embedded or integrated busbar 704 is connected with a MOSFET 706 via a pad 708 of the MOSFET 706. Each embedded or integrated busbar 704 is connected with two MOSFETs 706 on the PCB 700 (e.g., corresponding to one phase of the stator). In some embodiments, the shape of the busbar 704 varies internally with respect to the PCB 700 depending on the PCB 700's layout so that the pads 708 of the MOSFETs are connected to the busbar 704.

Figure 8:
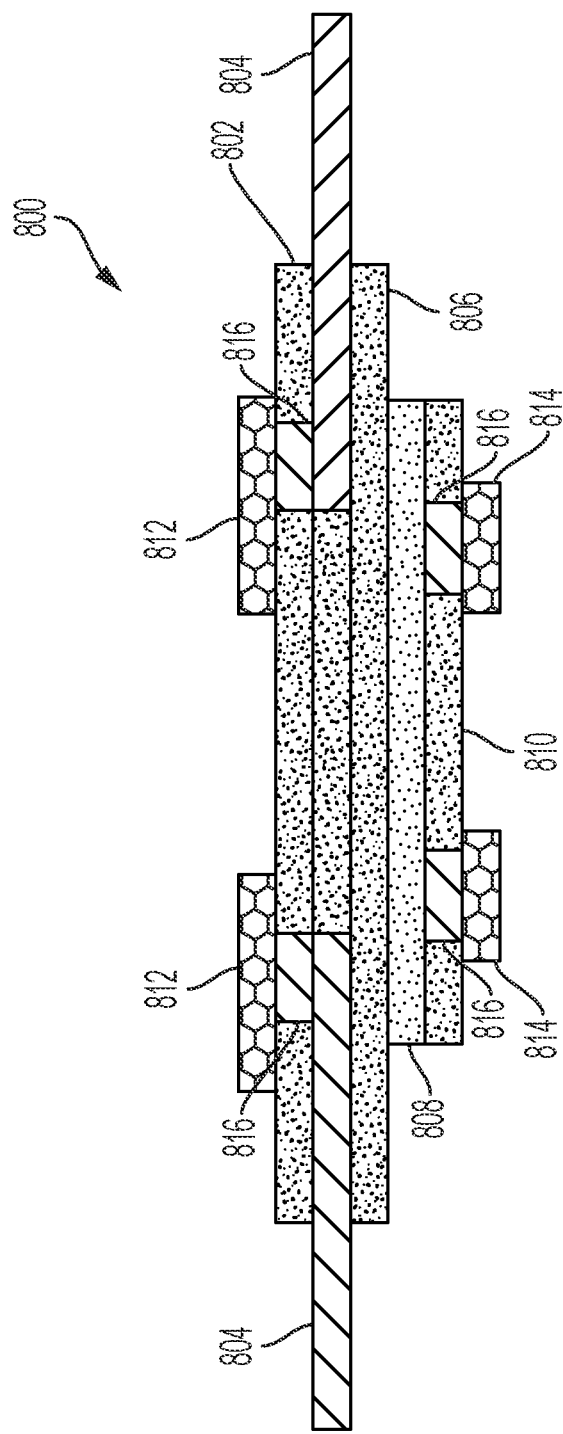
FIG. 8 illustrates a PCB including embedded busbars, according to embodiments described herein.

FIG. 8 illustrates another embodiment of a PCB 800. The PCB 800 includes a first PCB layer 802, busbars 804, a second PCB layer 806, a dielectric layer 808, a third PCB layer 810, switches or FETs 812, sensors or Hall-effect sensors 814, and internal conductive traces 816. The busbars 804 are embedded between the first PCB layer 802 and the second PCB layer 806. The dielectric layer 808 separates a power portion of the PCB 800 (e.g., including switches 812) and a sensing portion of the PCB 800, which includes sensors 814. The dielectric layer 808 isolates the sensors 814 from interference, for example, from the switching of the switches 812.

Figure 9C:
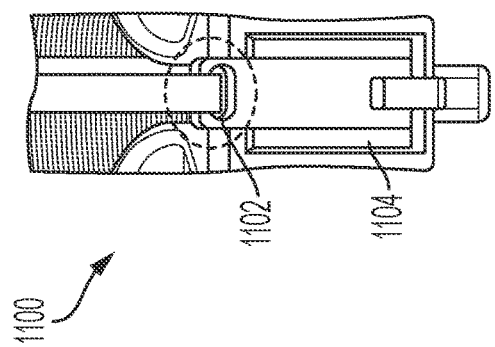
FIGS. 9A, 9B, 9C, 9D, 9E, and 9F illustrate motor stator terminals, according to embodiments described herein.
Figure 9F:
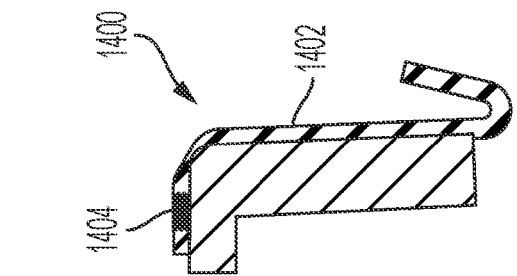
Figure 9B:
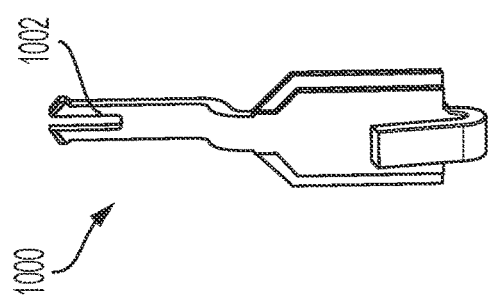
Figure 9E:
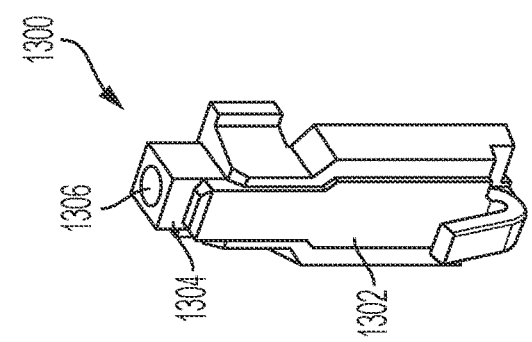
Figure 9A:
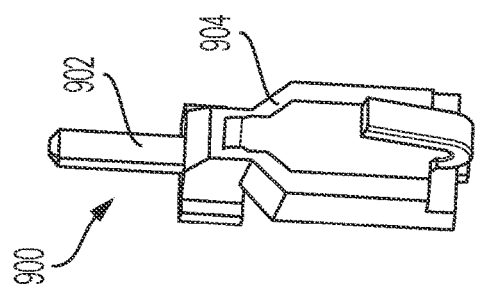

FIG. 9A illustrates an embodiment of a stator terminal 900 that includes a post 902 that can extend up to make electrical contact with an embedded busbar of a PCB. The stator terminal 900 is mounted to a non-conductive molded portion 904. In some embodiments, the stator terminal 900 is made from stamped metal. In other embodiments, the stator terminal 900 is made from a powdered metal ("PM") material. The stator terminal 900 can be welded or soldered to the embedded busbar of the PCB. In some embodiments, the stator terminal 900 includes a hook at a first end of the stator terminal 900.

FIG. 9B illustrates an embodiment of a stator terminal 1000 that includes a split-tip post 1002 that can extend up to make electrical contact with an embedded busbar of a PCB. The stator terminal 1000 can be mounted to a non-conductive molded portion. In some embodiments, the stator terminal 1000 is made from stamped metal. In other embodiments, the stator terminal 1000 is made from a PM material. In some embodiments, the stator terminal 1000 is welded or soldered to the embedded busbar of the PCB. In other embodiments, the stator terminal 1000 is press fit or snap fit (e.g., annularly snap fit) to a structure (e.g., a copper wedge piece) of the embedded PCB busbar. In some embodiments, the stator terminal 1000 includes a hook at a first end of the stator terminal 1000.

FIG. 9C illustrates an embodiment of a stator terminal 1100 that includes an aperture 1102 that interfaces with at least a portion of an embedded busbar of a PCB to make electrical contact with the embedded busbar of the PCB. The stator terminal 1100 can be mounted to a non-conductive molded portion 1104. In some embodiments, the stator terminal 1100 is made from stamped metal. In other embodiments, the stator terminal 1100 is made from a PM material. In some embodiments, the stator terminal 1100 is welded or soldered to the embedded busbar of the PCB. In other embodiments, the stator terminal 1100 receives a copper braid associated with the embedded PCB busbar. In some embodiments, the stator terminal 1100 includes a hook at a first end of the stator terminal 1100.

Figure 9D:
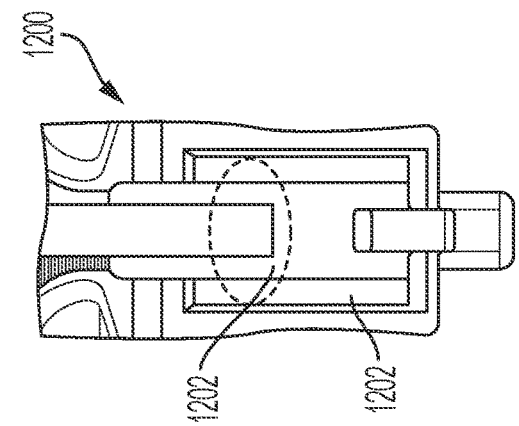

FIG. 9D illustrates an embodiment of a stator terminal 1200 that includes a surface 1202 that interfaces with at least a portion of an embedded busbar of a PCB to make electrical contact with the embedded busbar of the PCB. The stator terminal 1200 can be mounted to a nonconductive molded portion 1204. In some embodiments, the stator terminal 1200 is made from stamped metal. In other embodiments, the stator terminal 1300 is made from a PM material. The stator terminal 900 can be welded or soldered to the embedded busbar of the PCB. In some embodiments, the stator terminal 1200 includes a hook at a first end of the stator terminal 1200.

FIG. 9E illustrates an embodiment of a stator terminal 1300 that includes a surface 1302 that electrically connects with at least a portion of an embedded busbar of a PCB to make electrical contact with the embedded busbar of the PCB. The stator terminal 1300 can be mounted to a conductive second portion 1304. The conductive second portion 1304 includes an axial aperture 1306, such as a threaded screw hole. The axial aperture 1306 is oriented axially with respect to the rotor axis of a motor. A PCB can be screwed to the stator terminal 1300 through, for example, the embedded PCB busbar. An electrical connection is then made through the screw to the conductive second portion 1304 and the surface 1302. In some embodiments, the stator terminal 1300 is made from stamped metal. In other embodiments, the stator terminal 1300 is made from a PM material. In some embodiments, the stator terminal 1300 includes a single metal piece that includes both the surface 1302 and the axial aperture 1306. A conductive surface filler can be applied to a screw to provide additional connection strength and minimized impedance between the screw/hole interface. In some embodiments, the stator terminal 1300 includes a hook at a first end of the stator terminal 1300.

FIG. 9F illustrates an embodiment of a stator terminal 1400 that includes a surface 1402 that electrically connects with at least a portion of an embedded busbar of a PCB to make electrical contact with the embedded busbar of the PCB. The stator terminal 1400 includes an axial aperture 1404, such as a threaded screw hole. The axial aperture 1404 is oriented axially with respect to the rotor axis of a motor. A PCB can be screwed to the stator terminal 1400 through, for example, the embedded PCB busbar. In some embodiments, the stator terminal 1300 is made from stamped metal. In other embodiments, the stator terminal 1300 is made from a PM material. A conductive surface filler can be applied to a screw to provide additional connection strength and minimized impedance between the screw/hole interface. In some embodiments, the stator terminal 1400 includes a hook at a first end of the stator terminal 1400.

Figure 10A:
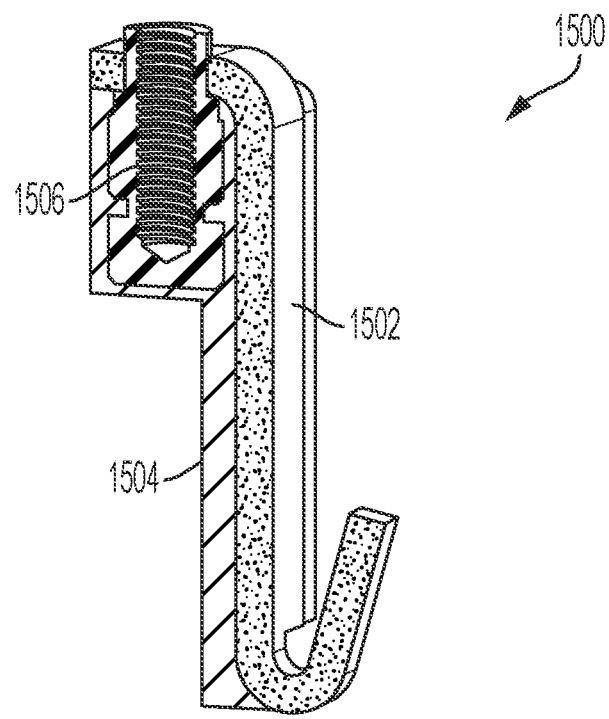
FIG. 10A illustrates a motor stator terminal, according to embodiments described herein.

FIG. 10A illustrates an embodiment of a stator terminal 1500 that includes a surface 1502 that electrically connects with at least a portion of a PCB to make electrical contact with the PCB. The stator terminal 1500 includes a non-conductive molded portion 1504 and is associated with an axial screw thread 1506. The axial screw thread 1506 is oriented axially with respect to the rotor axis of a motor. In some embodiments, the axial screw thread extends through a portion of the stator terminal 1500 and is configured to receive an axial screw. The axial screw can extend through the PCB into the axial screw thread to secure the PCB to the stator terminal 1500. In other embodiments, the axial screw thread 1506 is flush with a surface of the stator terminal 1500 or is recessed with respect to the stator terminal 1500. In some embodiments, the stator terminal 1500 and the axial screw thread 1506 are welded or otherwise affixed to one another. In some embodiments, the stator terminal 1500 is made from stamped metal. In other embodiments, the stator terminal 1500 is made from a PM material. A conductive surface filler can be applied to a axial screw thread to provide additional connection strength and minimized impedance between the axial screw/axial screw thread interface. In some embodiments, the stator terminal 1500 includes a hook at a first end of the stator terminal 1500.

Figure 10B:
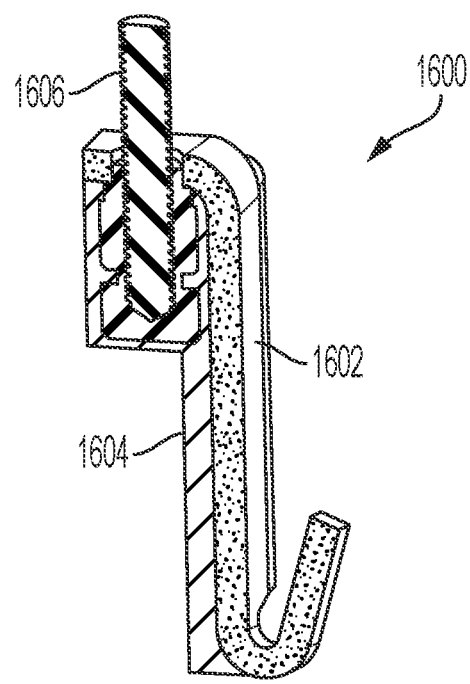
FIG. 10B illustrates a motor stator terminal, according to embodiments described herein

FIG. 10B illustrates an embodiment of a stator terminal 1600 that includes a surface 1602 that electrically connects with at least a portion of a PCB to make electrical contact with the PCB. The stator terminal 1600 includes a non-conductive molded portion 1604 and is associated with a threaded axial screw post 1606. The axial screw post 1606 is oriented axially with respect to the rotor axis of a motor. In some embodiments, the axial screw post extends through a portion of the stator terminal 1600 and is configured to receive lock nut to secure a PCB to the stator terminal. In some embodiments, the stator terminal 1600 and the axial screw post 1606 are welded or otherwise affixed to one another. In some embodiments, the stator terminal 1600 is made from stamped metal. In other embodiments, the stator terminal 1600 is made from a PM material. A conductive surface filler can be applied to a axial screw post to provide additional connection strength and minimized impedance between the axial screw post/lock nut interface. In some embodiments, the stator terminal 1600 includes a hook at a first end of the stator terminal 1600.

Figure 11:
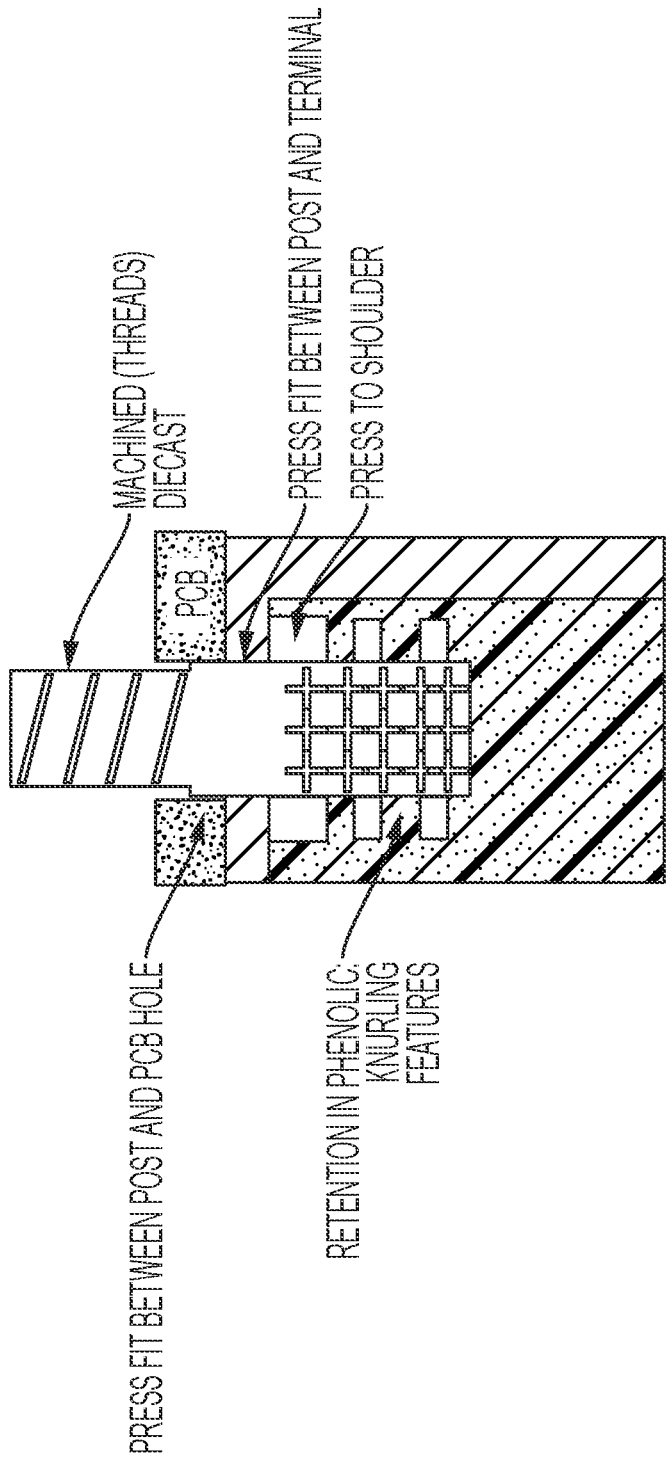
FIG. 11 illustrates attachment techniques associated with the motor stator terminal of FIG. 10B.

FIG. 11 illustrates a variety of techniques for manufacturing the axial screw post 1606 and securing the axial screw post to the stator terminal 1600. In some embodiments, the axial screw post 1606 is machined to include threads. In other embodiments, the axial screw post 1606 is diecast. The axial screw post 1606 can be manufactured from various materials, such as aluminum, brass, stainless steel, etc. The axial screw post 1606 can be secured to the stator terminal 1600 (e.g., the non-conductive molded portion 1604) using knurling or mechanical features to help retain the axial screw post 1606 in the non-conductive molded portion 1604 (e.g., a phenolic). In some embodiments, the axial screw post 1606 has the non-conductive molded portion 1604 molded around the axial screw post. Additionally, the axial screw post 1606 can use a press fit between the axial screw post 1606 and the surface 1602 of the stator terminal 1600. Similarly, the axial screw post 1606 can use a press fit between the axial screw post 1606 and the PCB. Additionally, the axial screw post 1606 can use a press fit between the axial screw post 1606 and a shoulder of the non-conductive molded portion 1604. The techniques described above with respect to the axial screw post 1606 can also be used with the axial screw thread 1506.

Thus, embodiments described herein provide, among other things, a power tool including a printed circuit board with embedded busbars. Various features and advantages are set forth in the following claims.

What is claimed is:

1. A power tool comprising:
a motor including a rotor and a stator, the stator including a plurality of stator terminals; and
a printed circuit board ("PCB") electrically connected to the stator, the PCB including a switch and an embedded busbar, a first end of the embedded busbar electrically connected to the switch, the embedded busbar extending away from the PCB, a second end of the embedded busbar electrically connecting to a stator terminal of the plurality of stator terminals for providing power to the motor using the switch,
wherein the embedded bus bar is embedded between two layers of the printed circuit board.

2. The power tool of claim 1, wherein:
power is provided to the motor from a power source by controlling the switch; and
the power source is a battery pack.

3. The power tool of claim 1, wherein the stator terminal further includes:
a block portion;
a metallic portion welded to the block portion; and
an insulating portion,
wherein the block portion and the metallic portion are recessed into the insulating portion, and
wherein the stator terminals further comprises a radial aperture oriented radially with respect to the motor and orthogonally to a rotor axis of the motor.

4. The power tool of claim 1, wherein:
the PCB further includes a dielectric layer separating a power portion of the PCB from a sensing portion of the PCB; and
the power portion includes the switch and the sensing portion includes a Hall-effect sensor.

5. The power tool of claim 1, wherein:
the stator terminal is mounted to a non-conductive block and includes a hook at a first end of the stator terminal and a post at a second end of the stator terminal;
the post makes electrical contact with the embedded busbar; and
the post includes a split tip.

6. The power tool of claim 1, wherein:
the stator terminal is further mounted to a conductive block;
the conductive block includes an axial aperture oriented axially with respect to a rotor axis of the motor; and
the axial aperture receives a fastener to fix the embedded busbar to the stator terminal.

7. The power tool of claim 1, wherein:
the stator terminal is mounted to a non-conductive block and includes a hook at a first end of the stator terminal and an axial aperture at a second end of the stator terminal oriented axially with respect to a rotor axis of the motor; and
the axial aperture receives a fastener to fix the embedded busbar to the stator terminal.

8. The power tool of claim 1, wherein:
the stator terminal is mounted to a non-conductive block and includes a hook at a first end of the stator terminal;
an axial screw thread extends through a second end into the non-conductive block, the axial screw thread oriented axially with respect to a rotor axis of the motor.

9. The power tool of claim 1, wherein:
the stator terminal is mounted to a non-conductive block and includes a hook at a first end of the stator terminal and an axial aperture at a second end of the stator terminal; and
wherein an axial screw post extends through axial aperture, the axial screw post oriented axially with respect to a rotor axis of the motor.

10. A power tool comprising:
a motor including a rotor and a stator, the stator including a plurality of stator terminals; and
a printed circuit board ("PCB") electrically connected to the stator, the PCB including a switch and an embedded busbar, a first end of the embedded busbar electrically connected to the switch, the embedded busbar extending away from the PCB, a second end of the embedded busbar electrically connecting to a stator terminal of the plurality of stator terminals for providing power to the motor using the switch,
wherein the stator terminal is mounted to a non-conductive block and includes a hook at a first end of the stator terminal.

11. The power tool of claim 10, wherein:
the stator terminal includes a post at a second end of the stator terminal; and
post makes electrical contact with the embedded busbar.

12. The power tool of claim 10, wherein:
the stator terminal includes an aperture at a second end of the stator terminal; and the aperture interfaces with at least a portion of the embedded busbar to make electrical contact with the embedded busbar.

13. The power tool of claim 10, wherein:

the stator terminal is mounted to a conductive block;

the conductive block includes an axial aperture oriented axially with respect to a rotor axis of the motor; and the axial aperture receives a fastener to fix the embedded busbar to the stator terminal.

14. The power tool of claim 10, wherein:

the stator terminal includes an axial aperture at a second end of the stator terminal oriented axially with respect to a rotor axis of the motor; and the axial aperture receives a fastener to fix the embedded busbar to the stator terminal.

15. The power tool of claim 10, wherein:

the stator terminal includes an axial aperture at a second end of the stator terminal;

an axial screw post extends through axial aperture, the axial screw post oriented axially with respect to a rotor axis of the motor.

16. A power tool comprising:

a motor including a rotor and a stator, the stator including a plurality of stator terminals; and a printed circuit board ("PCB") electrically connected to the stator, the PCB including a switch and an embedded busbar, a first end of the embedded busbar electrically connected to the switch, the embedded busbar extending away from the PCB, a second end of the embedded busbar electrically connecting to a stator terminal of the plurality of stator terminals for providing power to the motor using the switch, wherein the second end of the embedded busbar extends radially outward from the PCB about a central axis of the PCB.

17. The power tool of claim 16, wherein the switch is a field effect transistor.

18. The power tool of claim 16, wherein power is provided to the motor from a power source by controlling the switch.

19. The power tool of claim 18, wherein the power source is a battery pack.

20. The power tool of claim 16, wherein:

the stator includes a stator insulator; and the stator terminal is recessed into the stator insulator.

\* \* \* \* \*